June 14, 1955 K. E. APPERT ET AL 2,710,920

MULTICHANNEL FREQUENCY GENERATOR

Filed May 18, 1951 2 Sheets-Sheet 1

INVENTORS
Kurt E. Appert
BY Lennart G. Erickson
Lippincott & Smith
ATTORNEYS

INVENTOR.
Kurt E. Appert
BY Lennart G. Erickson
Lippincott & Smith
ATTORNEYS

United States Patent Office 2,710,920

Patented June 14, 1955

2,710,920

MULTICHANNEL FREQUENCY GENERATOR

Kurt E. Appert, Atherton Heights, and Lennart G. Erickson, Hillsborough, Calif., assignors to Lenkurt Electric Co., Inc., San Carlos, Calif., a corporation of Delaware Application May 18, 1951, Serial No. 227,087

6 Claims. (Cl. 250—36)

This invention relates to improvements in multichannel frequency generators suitable for use in carrier telephone or signal communication systems.

With the advent of amplifiers capable of handling frequency spectra which engross a hundred or more carrier or signal frequencies, we have found it is no longer necessary to provide individual amplifiers for each carrier or signal frequency. The present invention employs an amplifier of this type with numerous feedback or branch paths for generating a plurality of frequencies, which frequencies may be multiples of, and synchronized with, the input frequency.

Each feedback or branch path comprises an input frequency selective element, a frequency changing element and an output frequency selective element. Preferably, the frequency changing element employed is a modulator (using this term in the broad sense which will be more fully explained hereinafter). Usually there are also provided, in at least some of the feedback paths, some form of gain control or attenuator, such as a resistive pad, whereby the amplitudes of the signals in the various paths can be regulated to a common value.

An input circuit is provided which is essentially of the same nature as the branch paths just described. The output frequency selective element of this input circuit feeds at least one of the frequencies developed by the frequency changing element to the amplifier which steps up its amplitude and supplies it to the output circuit. If this new frequency is one which is to be used directly, a portion of the energy at that frequency may be drawn off through a proper filter and used for its intended purpose. Another portion, however, is selected by the input frequency selective element of one of the branch paths, changed in frequency again, and at least one of the newly developed frequencies selected by the output frequency selective element of the branch circuit is fed back to the amplifier input. This process can then be repeated as often as there are branch or feedback circuits.

The multiple frequencies thus produced can be used for various purposes. The invention offers a method of developing accurately spaced carriers for multiplex telephone or telegraph circuits. Frequencies developed in one branch circuit can be employed as carrier frequencies, as well as modulating frequencies in other branches, all as will be more fully described hereinafter.

In order that the foregoing may be more fully understood, the broad principles of modulation should be considered. Generally the term modulation means the multiplication of one frequency by another, this process resulting in various modulation product frequencies, depending on the type of modulation employed. Sum-and-difference sideband frequencies are practically always produced, and usually others are produced, part or all of which may be utilized by employing selective filters to segregate the individual frequencies. Where the two frequencies which are multiplied are the same, the process may be termed self-modulation in order that it may be distinguished from the former type.

One of the commonest forms of modulator is sometimes referred to as the "reversing switch" type. In this type of modulator, one of the frequencies is reversed at each half cycle of the other. This may be done mechanically, but is more usually accomplished in a ring or bridge modulator, wherein the "carrier" frequency is used to bias oppositely directed rectifiers so that they will pass current of the modulating frequency in the proper directions in successive half cycles of the carrier.

It will be noted that where the two frequencies are the same, it is not necessary to distinguish between "carrier" and "modulating" frequencies. An ordinary full-wave rectifier reverses the output current every half cycle, and the principal frequencies resulting are the "sum" or double input frequency and the "difference" or zero frequency, i. e., direct current. Various other modulation products are present in varying amounts. Other types of rectifiers produce still other frequencies in much the same way. Hence, in theory, "self-modulation" does not differ from the ordinary modulating process, and this should be kept in mind in what follows.

Self-modulation occurs in rectifiers of both the half-wave and full-wave types. From a Fourier analysis, the output of the half-wave rectifier contains both even and odd harmonics, whereas the output of the full-wave rectifier contains only even harmonics. Filter means may be employed in the outputs of the rectifiers to select any of the desired harmonics. It is thus apparent that product functions of two times the input frequency are readily obtainable from full-wave rectifiers. Thus, an important feature of our circuit lies in its flexibility in that the carrier supply frequencies or the frequencies developed in the rectifiers may comprise any frequency within the limits of the system, provided there is no duplication of frequencies in the common circuits. This also means that an output frequency generated in one of the feedback paths comprising high output frequencies may be introduced into a modulator in one of the paths comprising low output frequencies, resulting in a substantial increase in frequency for all subsequent output frequencies.

Present day commercially available amplifiers have frequency ranges which are flat from 20 kc. to 200 mc. The instant invention makes it possible to generate output frequencies which may be spaced throughout this entire band, also our invention may function equally well with amplifiers which cover different frequency bands.

Prior art systems capable of generating frequencies of comparable quantity and magnitudes are comprised of a series of frequency doublers and triplers. Such a system requires six or seven stages of doublers and three or four stages of triplers in the series. This means that anywhere from eight to eleven tubes are required, as well as separate amplifiers for each frequency utilized. The wide band amplifier which forms the basis for the present invention may be constructed with only two or three tubes, and of course no further tubes are required in the feedback paths. Thus great equipment simplification is achieved, resulting in economy of manufacture and reliability of performance. A further savings is realized in the operating power required for the present invention as contrasted with prior art systems. When using standby operation, as well as under actual operating conditions, the filaments of all of the tubes must be maintained at operating temperature. The power to maintain two or three tubes for operation is proportionately less than that required for eight to eleven tubes, not to mention the additional amplifiers and associated tubes which are required in prior art systems.

Added features of the present invention lie in its application to frequency translation, conversion and also demodulation. In frequency translation the entire band of output frequencies or signal channels may be shifted upward or downward. This is accomplished by merely changing one input frequency. An alternative way for achieving translation is to change the carrier supply frequencies. This method is particularly applicable when the carrier supply frequencies for each path are the same. These carrier supply frequencies may all be derived from a single source, such as a crystal-controlled supply, which may be stable to one part in ten million. Thus, the resulting frequencies in the band are very accurately disposed.

Frequency inversion may be accomplished with or without translation. One method for achieving inversion consists in changing the input frequency from that required for the lowest channel to that required for the highest channel, and further providing band-pass filters which select the difference of the modulated frequencies in any given path rather than the sum thereof. It might be re-emphasized here that modulators of the balanced type generate sideband frequencies of three times the carrier frequency plus and minus the signal frequencies, five times the carrier frequency plus and minus the signal frequency, etc., whereas modulators of the unbalanced type produce even multiples of carrier frequency plus and minus signal frequencies. Thus, by employing appropriate filters, it will be apparent to those skilled in the art that various arrangements for frequency inversion with or without translation may be achieved within the scope of this invention.

In order that the circuit may function as a demodulator, it is only necessary that the amplifier be reversed. In this manner the output frequencies are fed back through the various feedback paths to produce the original carrier supply frequencies as well as the input frequency. In this particular application the individual elements of the feedback path must, of course, be bilateral elements, which is the case generally in passive networks such as those described.

The combinations and arrangements of the present invention will be more apparent to those skilled in the art when explanied in detail in conjunction with the accompanying drawings wherein:

Fig. 1 is a block diagram illustrating our invention;

Fig. 1*a* is a modified component circuit suitable for use in the circuit of Fig. 1;

Figures 1, 1A, 2:
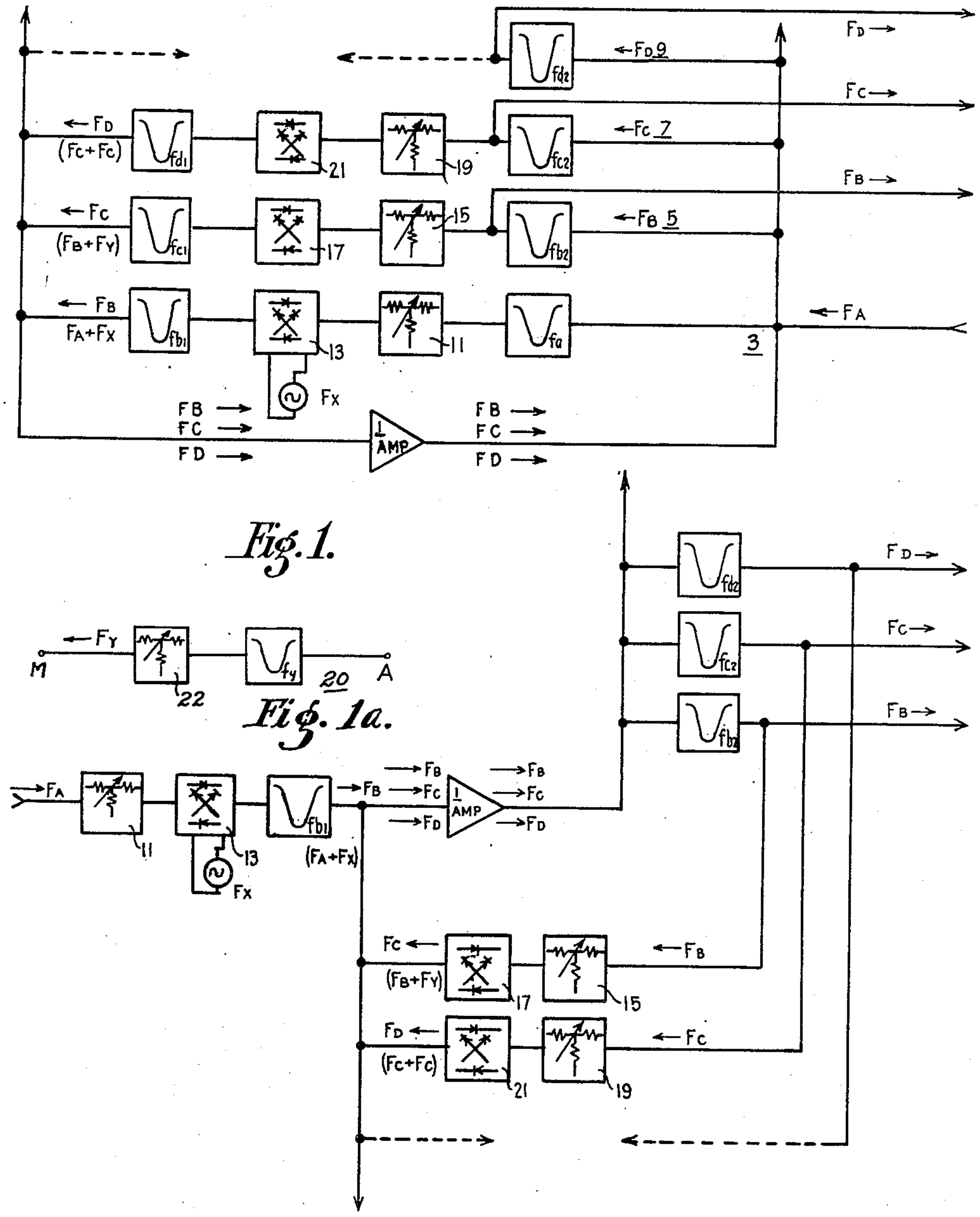
Fig. 2 is a modification of the block diagram of Fig. 1.

Referring to Fig. 1, a wide band amplifier 1 is provided with an input circuit 3 and feedback paths 5, 7 and 9. As has hereinbefore been pointed out, there is no limitation on the number of feedback paths which may be employed in the present invention provided there is no duplication of frequencies, which might appear in out-of-phase relationship, in the common circuits.

An input frequency $F_A$ passes through a band-pass filter $f_a$, which is designed to allow only this frequency to pass to an adjustable attenuator pad 11. This pad may be omitted if desired, but it does perform a useful function in that the amplitude of the input frequency $F_A$ may be adjusted relative to the amplitudes of other frequencies present in the overall circuit. Also, in the ring or bridge type modulators the "carrier" amplitude should be greater than the modulation frequency amplitude to achieve proper reversion of the "switches." This pad accordingly provides for such an adjustment.

A modulator 13 is provided to combine the input frequency $F_A$ and a carrier supply frequency $F_X$. This modulator may be of the balanced or unbalanced type as has hereinbefore been mentioned. In this particular application the modulator is of the bridge type, thus the output is the sum-and-difference of the carrier supply frequency $F_X$ and the input frequency $F_A$. A band-pass filter $f_{b1}$ similar in construction to $f_a$, is provided to select and pass only the sum of $F_A$ and $F_X$, which is then designated as a frequency $F_B$. This frequency follows a common path through amplifier 1, where it is amplified, to feedback path 5.

The carrier supply frequency $F_X$ is generated in an oscillator employing a very stable crystal. This crystal, for example, may be stable to one part in ten miilion. The reason for employing such a stable crystal is the fact that later frequencies appearing in the overall circuit will be, to a large extent, dependent upon the crystal controlled frequency. When frequencies of the order of 200 mc. are desired in the output of this circuit, it is readily apparent that when these higher frequencies are dependent upon a relatively low input or carrier supply frequency, the supply frequency must be very stable.

As the amplifier 1 is located in a circuit which is common to the input and many feedback circuits, it is apparent that the frequencies which will be amplified therein will cover a very large band or spectra. Accordingly, by employing the presently available amplifiers, which are flat from 20 kc. to 200 mc., we can cope with the problem presented in generating evenly disposed frequencies covering large frequency bands. As will be hereinafter set forth, adjustable attenuator pads are provided throughout the network for equalizing the various amplitudes of the different frequencies appearing in the circuits. By employing these pads, the response of the amplifier may be increased somewhat and also compensated for when needed.

The feedback path 5 is substantially similar to the input circuit 3. The elements, however, are adjusted to handle different order frequencies. At the input of this path there is located a band-pass filter $f_{b2}$, which is designed to select and pass only the frequency $F_B$. A portion of the filtered frequency $F_B$ is tapped off for utilization in the output. The remainder of the frequency $F_B$ is directed through an adjustable attenuator pad 15 and thence to a modulator 17.

The modulator 17 may be of the same type as modulator 13. A second carrier supply frequency $F_Y$ is introduced into this modulator to be combined with carrier $F_B$. A band-pass filter $f_{c1}$ is provided in the output of modulator 17 to select and pass only the upper sideband resulting from the modulation. This upper sideband will, of course, be equal to the sum of $F_B$ and $F_Y$, which we may designate as frequency $F_C$.

The second generated frequency $F_C$ now appears in the common amplifier circuit and is accordingly amplified and directed to the feedback path 7.

This feedback path may be identical with feedback path 5 with the exception that the elements therein are adjusted to handle frequencies different from those present in feedback path 5. However, to illustrate the flexibility of the present invention, a self-modulator will be utilized in this path. The carrier frequency $F_C$ is first filtered in a band-pass filter $f_c$, which is designed to select and pass only this carrier frequency. A portion of the filtered carrier $F_C$ is directed to a second output circuit, whereas the remainder of this carrier enters adjustable pad 19, which provides for any necessary adjustment in amplitude thereof.

Modulator 21 is provided in feedback path 7 for doubling the output frequency of pad 19, thus no carrier supply frequency is needed for this path. The upper sideband of the output of modulator 21, $F_C$ plus $F_C$, is selected and passed by band-pass filter $f_{d1}$, the output of which is designated as frequency $F_D$. The lower sideband, it will be recalled, is a D. C. voltage.

Output frequency $F_D$ is directed around the common circuit to amplifier 1 where it is amplified and then passed to feedback path 9. This feedback path contains similar elements to those of feedback path 5 and input path 3, the exception again being that the elements are designed to handle frequencies different from those in the other paths. Accordingly, it is believed that a further showing of feedback paths is unnecessary and would only tend to complicate the drawings herein. Thus, it will be apparent that frequency $F_D$ is filtered in the filter network $f_{d2}$ and a portion thereof is directed to a third output circuit while the remainder is attenuated, modulated and filtered to produce further output frequencies which are likewise directed through the wide band amplifier 1 and thence to further feedback paths.

In Figure 1*a* there is shown a circuit 20 including a band-pass filter $f_y$ and a pad 22 which is adapted for connection at terminals A and M respectively to the common circuit of amplifier 1 and to modulator 17 of Fig. 1 to introduce carrier supply frequency $F_Y$ to this modulator. The pad is only necessary if adjustments in the amplitude of the frequency are required prior to modulation. Circuits of this nature may be employed to replace all of the carrier supply frequencies with the exception of the carrier supply frequency $F_X$. This is based upon the assumption that these particular carrier supply frequencies will appear somewhere in the overall circuit as products of the modulation processes.

Provisions of this nature for the carrier supply frequencies are particularly applicable when the circuit is arranged for regenerative application. In the system that has just been described, it will be noted that the generation of frequencies in the order of 200 mc. will require numerous feedback paths if, for example, the input frequency $F_A$ and the input carrier supply frequencies $F_X$ and $F_Y$ are in the order of 100 kc. Accordingly, we have arrived at a satisfactory solution for eliminating a number of these feedback paths to still attain very high frequency outputs.

The system provided for enabling the limiting of undue numbers of feedback paths consists in the employment of self-modulators in lieu of modulators 13, 17, etc. With this system, carrier supply frequencies $F_X$ and $F_Y$, etc., are no longer necessary. By assuming the input frequency $F_A$ is 100 kc., the output of the path 3 will be 200 kc., which will be the input to path 5. The output of the path 5 will be doubled, and hence 400 kc. will be the input to path 7. The output of the path 7 will be 800 kc., which will be the input to path 9. By employing this frequency doubling or self-modulation, it is readily apparent that relatively few feedback paths will be required to attain an output frequency of 200 mc. Of course the output frequencies will be spaced unevenly over the band from 200 kc. to 200 mc. An even distribution over this band can readily be accomplished by combining these frequencies in any combination whatsoever. For example, a frequency of 1000 kc. may be attained by combining 800 kc., the output of path 7, with 200 kc., the output of the input path. This may be accomplished by providing a further band-pass filter connected preferably to the output side of the common amplifier path capable of selecting 1000 kc.

These examples are presented merely to acquaint those skilled in the art with the high degree of flexibility which our circuit possesses and they are to be taken in no way as limitations upon the present circuit.

The frequency selective means $f_{b1}$, $f_{c1}$ and $f_{d1}$ may be omitted from our circuit without harming the overall operation thereof. These filters were provided to select the desired frequencies which would be further utilized. In this manner, power was not expended in preserving frequencies which were not further used. When the filters are omitted, both upper and lower sideband frequencies will be present in the common circuits. The heretofore unutilized frequencies may be amplified and then selected by appropriate frequency selective means for output use. Thus a greater number of output frequencies becomes available for use.

Further, the filter $f_a$ may also be eliminated, resulting in a circuit capable of producing even more output frequencies. By way of example, assume an input frequency of 100 kc. and a carrier supply frequency of 1000 kc. The first products of modulation will be 1100 kc. and 900 kc. Since there are no frequency selective means in this path, these frequencies are amplified and fed back to the input circuit to provide modulation products of 100 kc., 2100 kc. and 1900 kc. Thus it is apparent that in this manner any number of frequencies may be produced. Appropriate frequency selective means may be employed in additional output circuits to preserve each or any of these frequencies for further use.

Referring to Fig. 2, the block diagram of Fig. 1 may be readily considered to consist of parallel output circuits having a common connection to the output side of amplifier 1. These circuits comprise, respectively, band-pass filters $f_{b2}$, $f_{c2}$ and $f_{d2}$. The circuit including pad 15 and modulator 17 with band-pass filter $f_{c1}$ eliminated connects from the output side of filter $f_{b2}$ to the common input terminal of amplifier 1. This circuit may now be termed a frequency changing circuit. Likewise, the portion of feedback or branch path 7, not including band-pass filter $f_{c2}$, and with filter $f_{c1}$ eliminated, also comprises a frequency changing circuit. Thus each frequency changing circuit connects respectively to the output side of an output circuit, and further, to the common input terminal of amplifier 1. The input circuit which comprises pad 11, modulator 13 and filter $f_{b1}$, filter $f_a$ being eliminated from this circuit, also connects to the common input terminal of amplifier 1.

This particular arrangement differs from that of Fig. 1 in that filters $f_a$, $f_{c1}$ and $f_{d1}$ have been eliminated. Although a circuit including fewer elements is achieved, this advantage is offset by the increased power requirements in the amplifier. This, of course, is due to the fact that more frequencies are present in the overall circuit.

In this application all diagrams are shown with single wire connections, as ground connections would only complicate the drawings without aiding the explanation of our system.

Figure 3:
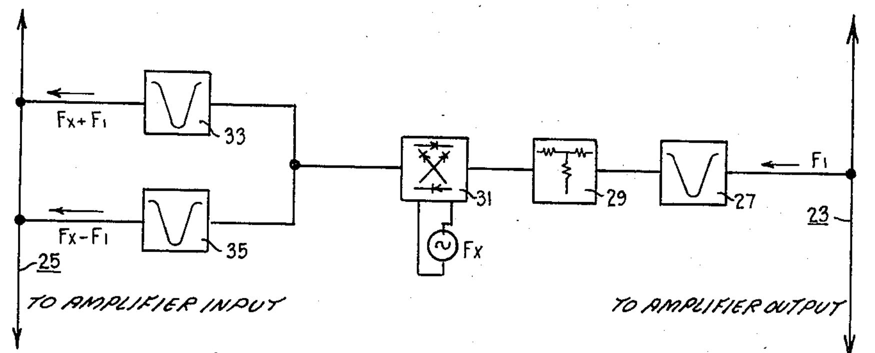
Fig. 3 is a block diagram of a modified form of feedback path suitable for use in the present invention.

In Fig. 3 there is represented a modified type feedback or branch path which is adapted for use in the present invention. The common terminals 23 and 25 are adapted to connect with the output and input sides of the wide band amplifier respectively. A frequency $F_1$ may be the input frequency to a band-pass filter 27. This band-pass filter is designed to pass only the input frequency $F_1$ and thus exclude other frequencies which appear in the common circuit at terminal 23. The output of the band-pass filter 27 is directed to an adjustable attenuator pad 29. This pad may be employed to adjust the amplitude of the filtered input frequency $F_1$ relative to the amplitudes of other frequencies appearing in the overall circuit. The adjusted output of pad 29 is fed to modulator 31, which also receives a carrier supply frequency $F_X$. The frequency outputs of this modulator, it will be readily apparent, are the sum-and-difference frequencies of the inputs. Accordingly, we provide two band-pass filters 33 and 35 connected in parallel to the output of modulator 31. Filter 33 is designed to select $F_X$ plus $F_1$, whereas filter 35 selects $F_X$ minus $F_1$. Thus the common terminal 25 receives both the sum-and-difference modulation frequencies.

This branch path is adapted to replace any of the feedback paths 5, 7, 9, etc., or the input path 3. Of course additional filter means will be required in the circuit arrangement shown in Fig. 1 when one of the feedback paths is replaced by the modified type feedback path. Assume, for example, that our original input frequency is 1000 cycles and a 12,000 cycle output is desired. The first branch circuit may be of the unmodified type which is designed to modulate the 1000 cycle input on a 10,000 cycle carrier, giving an 11,000 cycle output. A second branch circuit of the modified type may modulate the 11,000 cycle frequency with the original 1000, giving possible output frequencies of 12,000 and 10,000. Output filters 33 and 35 are provided for both of those modulation products, both are amplified, and a branch circuit 20 shown in Fig. 1*a*, and including a filter in this example, passing the 1000 cycle frequency, is used to feed this carrier to the first branch.

The frequencies mentioned will develop, even though it might appear that they would not; any transient appearing on the input side of the circuit will be amplified, the Fourier components of the transient corresponding to the necessary 1000 cycle carrier input to the first branch will be passed by the proper filters, and the missing carrier will thus be developed.

The advantages inherent in a path of this nature are readily apparent. For example, the sum-and-difference frequency outputs of this path may each be utilized as a carrier frequency or frequency translation may be achieved in either direction. Further, the provision of two frequency outputs makes it possible to utilize one of the outputs to replace a carrier supply frequency in another path, whereas the other output may be the input to the same or other paths.

Figure 4:
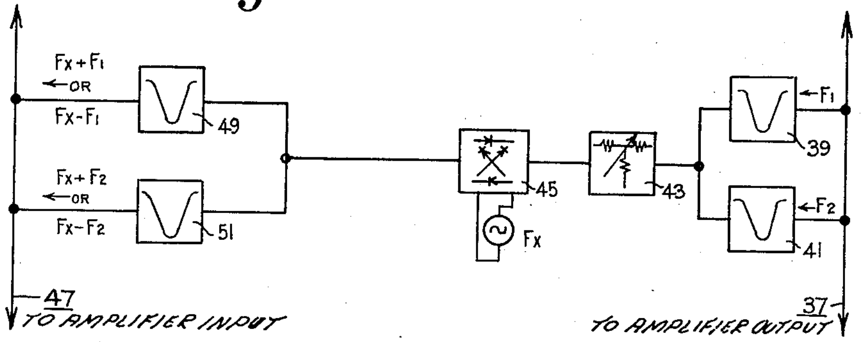
Fig. 4 represents a different modified type feedback path.

Referring to Fig. 4, a further modified type feedback path is provided which will accommodate two input frequencies. The input side 37 of this path provides for the introduction of input frequencies $F_1$ and $F_2$. This input is arranged as a parallel circuit having band-pass filter 39 and band-pass filter 41, respectively, located in the branches thereof. Filter 39 is adapted to pass only the input frequency $F_1$, whereas filter 41 likewise selects only input frequency $F_2$. The common output circuit of the filters is connected to an adjustable pad 43 which is provided to adjust the amplitudes of these frequencies. The output of this pad feeds a modulator 45 which is also supplied by a carrier supply frequency $F_X$. A common output terminal 47 is connected through parallel paths to the output side of modulator 45. A band-pass filter 49 is located in one of the branches of this circuit, whereas a band-pass filter 51 is located in the other branch thereof. Filter 49 is designed to select either the sum or difference frequency of $F_X$ and $F_1$, whereas filter 51 selects either the sum or difference frequency of $F_X$ and $F_2$. These sum-and-difference frequencies may be utilized as carrier supply frequencies or as input frequencies for further feedback paths. It will be apparent that by selecting the sum of one input frequency and the carrier supply frequency and the difference of the other input frequency and the carrier supply, a wider disposition of output frequencies may be attained. Alternatively, the selection of both sum or both difference frequencies results in a closer disposition of the output frequencies. Further, by proper selection it is apparent that either upward or downward frequency translation may be achieved.

Figure 5:
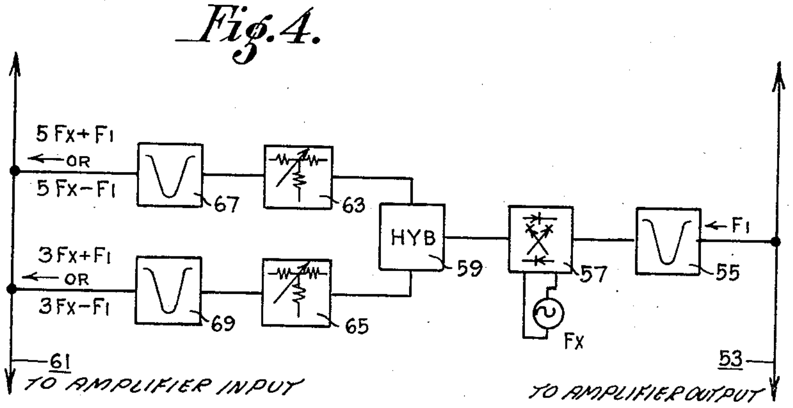
Fig. 5 shows a further modification of a feedback path suitable for use in the present invention.

In Fig. 5 there is represented a further type modified feedback path which is suitable for use in the present invention. A single input frequency $F_1$ is introduced into this path at input terminal 53. The band-pass filter 55 insures that modulator 57 will receive only this frequency from the common input circuit. A carrier supply frequency $F_X$ is introduced into the modulator for combination with input frequency $F_1$. A hybrid coil 59 separates the modulation harmonic frequencies so that different order harmonics may follow individual paths to the common output terminal 61. Since the amplitudes of harmonic frequencies are unequal, adjustable pads 63 and 65 are provided in the output circuits. In order that the third harmonic frequency, for example, may be separated from the fifth harmonic frequency, appropriate band-pass filters 67 and 69 are provided to respectively select the outputs of pads 63 and 65. Thus it is apparent that either $5F_X$ plus $F_1$ or $5F_X$ minus $F_1$ may appear in the output of band-pass filter 67 while $3F_X$ plus $F_1$ or $3F_X$ minus $F_1$ may appear in the output of band-pass filter 69. These output frequencies may be utilized in the same manner as the output frequencies derived in the other modified feedback paths. An added advantage of this particular arrangement, however, consists in the generation of much higher output frequencies, thus a lesser number of feedback paths will be required to attain a given frequency output. Further, these harmonic frequencies may be employed as carrier supply frequencies for other feedback paths, thus greatly increasing the frequency outputs which are derived from the overall circuit.

The flexibility inherent in this system permits the utilization of any or all of the modified type feedback paths in combination with each other or with feedback paths of the unmodified type. Thus it is possible to develop a frequency spectra having irregular or evenly disposed frequencies of any separation desired located therein. Further, the modified type feedback paths may be employed in the present system when frequency translation, inversion or demodulation is desired.

Additional modifications of the various circuit arrangements shown and described will be readily apparent to those skilled in the art and, accordingly, it is desired that this invention not be limited to the specific examples shown and described.

What is claimed is:

1. A multi-channel frequency generator comprising an amplifier having input and output circuits, a plurality of branch paths each comprising a plurality of band-pass filters, at least one adjustable attenuator pad and a modulator, the said branch paths being connected to said amplifier between said input and output circuits, connections in an input circuit for receiving base frequency energy in the form of an unmodulated carrier, frequency changing means in each of said paths adapted to operate successively on said energy to change the carrier frequency thereof, a plurality of frequency selective means located in said paths, each of said selective means being adapted to select a different carrier frequency whereby the carrier frequencies in each path are dependent upon said base frequency carrier and the carrier frequencies present in some paths are dependent upon carrier frequencies in other paths, and a plurality of output terminals respectively in electrical connection with certain of the frequency selective means whereat a portion, at least, of the carrier frequency energy in the paths is present for utilization.

2. A multi-frequency generator comprising an amplifier responsive to a wide band of frequencies, a plurality of frequency selective circuits connected in parallel to the output of said amplifier, an input circuit connected to supply a base frequency to said amplifier, a plurality of frequency changing circuits each connected between one of said frequency selective circuits and the input of said amplifier, each of said frequency changing circuits including a modulator and each frequency selective circuit including a band-pass filter, a plurality of further band-pass filters, connections from the further band-pass filters to the modulators, and individual connections from the output of the amplifier to the further band-pass filters, one of said frequency selective circuits being adapted to said base frequency and each of the other frequency selective circuits being adapted to select a different frequency developed by one of said frequency changing circuits, and output terminals connected to the individual frequency selective circuits whereby different frequencies are available for utilization.

3. A multi-frequency generator comprising an amplifier responsive to a wide band of frequencies, a plurality of frequency selective circuits connected in parallel to the output of said amplifier, an input circuit connected to supply a base frequency to said amplifier, a plurality of frequency changing circuits each connected between one of said frequency selective circuits and the input of said amplifier, a modulator included in each frequency changing circuit, a plurality of carrier frequency supply sources, connections from said sources to said modulators to admit carrier supply frequencies thereto, one of said frequency selective circuits being adapted to select said base frequency and each of the other frequency developed by one of said frequency changing circuits, and output terminals connected to the individual frequency selective circuits whereby the different frequencies are available for utilization.

4. A multi-frequency generator comprising an amplifier having input and output circuits, a plurality of branch paths connected to said amplifier between said circuits, connections in an input circuit for receiving base frequency energy in the form of an unmodulated carrier, frequency changing means in each of said paths adapted to operate successively on said energy to change the carrier frequency thereof, a plurality of frequency selective means located respectively in said paths each of said frequency selective means comprising an input filter connected to the output circuit of said amplifier and adapted to pass a carrier frequency of $f$ cycles and a pair of output filters connected to be supplied in parallel and to pass respectively carrier frequencies of $F+f$ and $F-f$ cycles to an input circuit of said amplifier, the frequency changing means in said one of the branch paths being interposed between the input and output filters and having terminals whereat a carrier frequency of F cycles is adapted to be introduced, each of said selective means being adapted to select a different carrier frequency whereby the carrier frequencies in each path are dependent upon said base frequency carrier and the carrier frequencies present in some paths are dependent upon carrier frequencies in other paths, and a plurality of output terminals respectively in electrical connection with certain of the frequency selective means whereat a portion, at least, of the carrier frequency energy in the paths is present for utilization.

5. A multi-frequency generator comprising an amplifier having input and output circuits, a plurality of branch paths connected to said amplifier between said circuits, connections in an input circuit for receiving base frequency energy in the form of an unmodulated carrier, frequency changing means in each of said paths adapted to operate successively on said energy to change the carrier frequency thereof, a plurality of frequency selective means located respectively in said paths, each of said frequency selective means comprising a pair of input filters each connected to the output circuit of said amplifier and adapted respectively to pass carrier frequencies of $f_1$ and $f_2$ cycles to the frequency changing means, said frequency changing means having terminals whereat a carrier frequency of F cycles is adapted to be introduced, a pair of output filters connected to the frequency changing means to be supplied in parallel and to pass, respectively, carrier frequencies selected from the group comprising $F+f_1$, $F-f_1$, $F+f_2$, and $F-f_2$ to an input circuit of said amplifier, each of said selective means being adapted to select a different carrier frequency whereby the carrier frequencies in each path are dependent upon said base frequency carrier and the carrier frequencies present in some paths are dependent upon carrier frequencies in other paths, and a plurality of output terminals respectively in electrical connection with certain of the frequency selective means whereat a portion, at least, of the carrier frequency energy in the paths is present for utilization.

6. A multi-frequency generator comprising an amplifier having input and output circuits, a plurality of branch paths connected to said amplifier between said circuits, connections in an input circuit for receiving base frequency energy in the form of an unmodulated carrier, frequency changing means in each of said paths adapted to operate successively on said energy to change the carrier frequency thereof, a plurality of frequency selective means located respectively in said paths each of said frequency selective means comprising an input filter connected to the output circuit of said amplifier adapted to pass a carrier frequency of $f$ cycles, the frequency changing means in said one of the branch paths having terminals whereat a carrier frequency of F cycles is adapted to be introduced, a pair of output filters respectively adapted to pass different harmonic frequencies of F cycles plus or minus the carrier of $f$ cycles to an input circuit of said amplifier, means for feeding the output of the frequency selective means to said output filters, each of said selective means being adapted to select a different carrier frequency whereby the carrier frequencies in each path are dependent upon said base frequency carrier and the carrier frequencies present in some paths are dependent upon carrier frequencies in other paths, and a plurality of output terminals respectively in electrical connection with certain of the frequency selective means whereat a portion, at least, of the carrier frequency energy in the paths is present for utilization.

References Cited in the file of this patent

UNITED STATES PATENTS

| | | |
|---|---|---|
| 1,657,462 | Espenschied | Jan. 31, 1928 |
| 2,159,595 | Miller | May 23, 1939 |
| 2,380,868 | Peterson | July 31, 1945 |

FOREIGN PATENTS

| | | |
|---|---|---|
| 506,790 | Great Britain | Dec. 4, 1936 |
| 996,124 | France | Aug. 29, 1951 |